(12) United States Patent
Bowers

(10) Patent No.: US 8,106,379 B2
(45) Date of Patent: Jan. 31, 2012

(54) HYBRID SILICON EVANESCENT PHOTODETECTORS

(75) Inventor: John E. Bowers, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 773 days.

(21) Appl. No.: 11/734,559

(22) Filed: Apr. 12, 2007

(65) Prior Publication Data

US 2009/0016399 A1 Jan. 15, 2009

Related U.S. Application Data

(63) Continuation-in-part of application No. 11/534,560, filed on Sep. 22, 2006.

(60) Provisional application No. 60/795,064, filed on Apr. 26, 2006.

(51) Int. Cl.
*H01L 29/06* (2006.01)
(52) U.S. Cl. ...................... 257/14; 257/22; 257/E33.008
(58) Field of Classification Search ...................... 257/14
See application file for complete search history.

(56) References Cited

U.S. PATENT DOCUMENTS

| 6,074,892 | A | 6/2000 | Bowers et al. | |
|---|---|---|---|---|
| 6,130,441 | A | 10/2000 | Bowers et al. | |
| 6,147,391 | A | 11/2000 | Bowers et al. | |
| 6,465,803 | B1 | 10/2002 | Bowers et al. | |
| 7,535,089 | B2 * | 5/2009 | Fitzgerald | 257/684 |
| 2006/0239308 | A1 * | 10/2006 | Husain et al. | 372/29.013 |
| 2007/0291808 | A1 * | 12/2007 | Ledentsov et al. | 372/50.11 |

OTHER PUBLICATIONS

Fang et al., "An optically pumped silicon evanescence laser," University of California Santa Barbara, ECE Department, Santa Barbara, CA 93106-9560, two pages.
Park et al., "Silicon evanescent laser," University of California Santa Barbara, ECE Department, Santa Barbara, CA 93106-9560, six pages.
Bowers, "Optical gain and lasing on silicon," Department of Electrical and Computer Engineering, University of California, Santa Barbara, four pages.
Bowers, "Silicon evanescent laser," Department of Electrical and Computer Engineering, University of California, Santa Barbara, five pages.

* cited by examiner

*Primary Examiner* — Quoc Hoang
*Assistant Examiner* — Tony Tran
(74) *Attorney, Agent, or Firm* — Gates & Cooper LLP

(57) ABSTRACT

Photodetectors and integrated circuits including photodetectors are disclosed. A photodetector in accordance with the present invention comprises a silicon-on-insulator (SOI) structure resident on a first substrate, the SOI structure comprising a passive waveguide, and a III-V structure bonded to the SOI structure, the III-V structure comprising a quantum well region, a hybrid waveguide, coupled to the quantum well region and the SOI structure adjacent to the passive waveguide, and a mesa, coupled to the quantum well region, wherein when light passes through the hybrid waveguide, the quantum well region detects the light and generates current based on the light detected.

22 Claims, 12 Drawing Sheets

HYBRID SILICON EVANESCENT PHOTODETECTORS

CROSS-REFERENCE TO RELATED APPLICATIONS

This application is a continuation-in-part application of the following co-pending and commonly-assigned U.S. patent application:

Ser. No. 11/534,560, filed Sep. 22, 2006, entitled "III-V PHOTONIC INTEGRATION ON SILICON," by John E. Bowers, which claims priority to Ser. No. 60/795,064, filed Apr. 26, 2006, entitled "III-V PHOTONIC INTEGRATION ON SILICON," by John E. Bowers, and to Ser. No. 60/760,629, filed Jan. 20, 2006, entitled "OPTICAL GAIN AND LASING ON SILICON," by John E. Bowers, which applications are incorporated by reference herein.

SPONSORED RESEARCH OR DEVELOPMENT

This invention was made with Government support under Grant No. W911NF-05-1-0175, awarded by the Department of Defense. The Government has certain rights in this invention.

BACKGROUND OF THE INVENTION

1. Field of the Invention

The present invention relates generally to semiconductor devices, and, more specifically, to integration of III-V optical devices with silicon substrates and circuits.

2. Description of the Related Art

Semiconductor chip level bonded devices have found uses in several consumer and commercial applications. Typically, semiconductor devices are made from a single type of material, or different types of material are grown onto a substrate based on lattice matching and compatible crystalline structures. Devices manufactured from III-V materials are typically grown on gallium arsenide or other compound semiconductor substrates. These devices are difficult to integrate with electronic devices fabricated on silicon.

However, there are many advantages to integrating electronic and photonic devices on a single substrate. Passive photonic devices such as arrayed waveguide routers (AWG) are commonly fabricated on silicon. Some active photonic devices have been demonstrated on silicon such as modulators and Raman lasers. However, most active photonic devices require single crystal material, which is difficult to grow on silicon because of the large lattice mismatch between the semiconductor with the proper bandgaps and silicon itself. The problem with the present discrete photonic devices is that the performance can be improved with integration, and the cost and size is much smaller. Silicon is a preferred semiconductor material, because it is easily processed, it is readily available for reasonable cost and high quality, and complex VLSI electronic circuits are readily available. However, silicon-based modulators or lasers or other photonic devices are not as efficient at light emission or absorption as their III-V based counterparts. It can be seen, then, that there is a need in the art for a larger scale integration between III-V materials and silicon.

SUMMARY OF THE INVENTION

To minimize the limitations in the prior art, and to minimize other limitations that will become apparent upon reading and understanding the present specification, the present invention provides a technology for making photonic integrated circuits on silicon. By bonding a wafer of III-V material as an active region to silicon and removing the substrate, the lasers, amplifiers, modulators, and other devices can be processed using standard photolithographic techniques on the silicon substrate. The coupling between the silicon waveguide and the III-V gain region allows for integration of low threshold lasers, tunable lasers, and other photonic devices and integrated circuits with Complimentary Metal Oxide Semiconductor (CMOS) integrated circuits.

A photodetector in accordance with the present invention comprises a silicon-on-insulator (SOI) structure resident on a first substrate, the SOI structure comprising a passive waveguide, and a III-V structure bonded to the SOI structure, the III-V structure comprising a quantum well region, a hybrid waveguide, coupled to the quantum well region and the SOI structure adjacent to the passive waveguide, and a mesa, coupled to the quantum well region, wherein when light passes through the hybrid waveguide, the quantum well region detects the light and generates current based on the light detected. Such a photodetector further optionally includes the quantum well region is an AlGaInAs quantum well region, the hybrid waveguide is tilted with respect to the passive waveguide, the hybrid waveguide is tilted by seven degrees with respect to the passive waveguide, the photodetector is part of an array of photodetectors, the photodetector is integrated with at least one other electronic device, the at least one other electronic device being a CMOS device, the mesa is implanted with protons, and the coupling between the passive waveguide and the hybrid waveguide is evanescent.

An integrated laser/photodetector device in accordance with the present invention comprises a semiconductor-on-insulator (SOI) structure resident on a first substrate, the SOI structure comprising a passive waveguide, a semiconductor structure bonded to the SOI structure, the semiconductor structure comprising a quantum well region, a hybrid waveguide, coupled to the quantum well region and the SOI structure adjacent to the passive waveguide, and a mesa, coupled to the quantum well region, and a lasing device, coupled to the hybrid waveguide, for providing light to the hybrid waveguide to generate current in the photodetector.

Such a device further optionally includes the coupling between the hybrid waveguide and the passive waveguide is evanescent, the SOI structure comprises a silicon substrate, the semiconductor structure comprises a III-V semiconductor material, the lasing device comprises a ring laser, the lasing device is coupled to the photodetector via a directional coupler, and at least one additional photodetector coupled to the lasing device.

Other features and advantages are inherent in the system disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Figure 1:
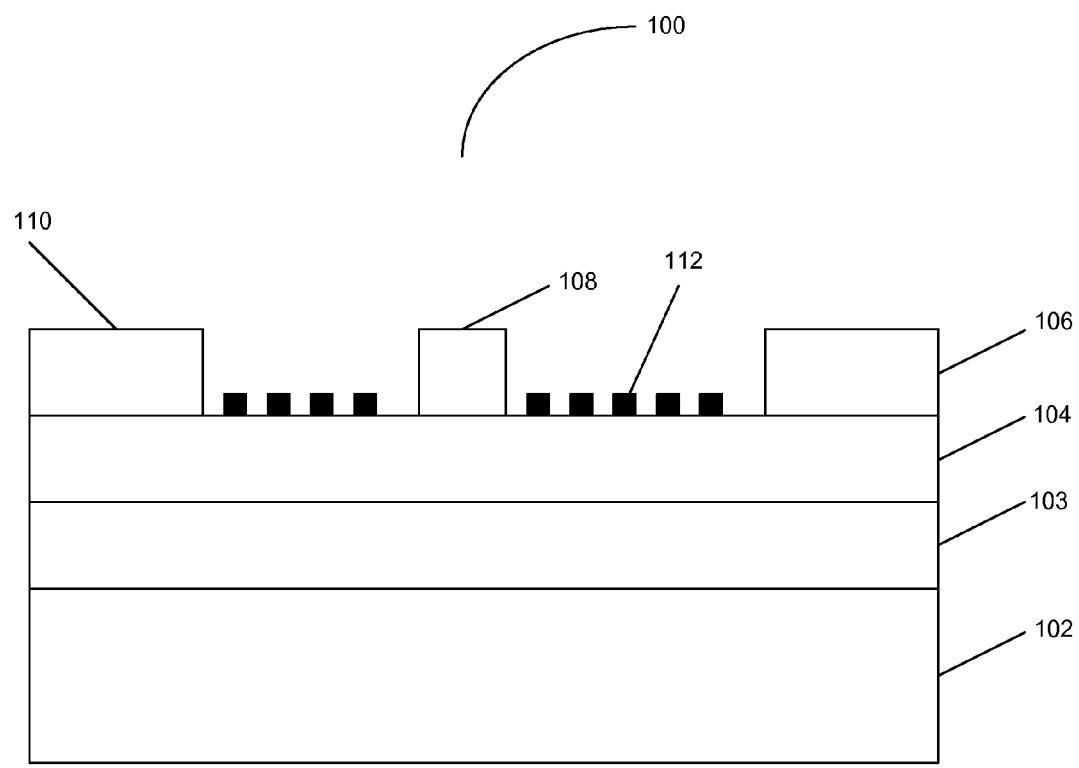
FIG. 1 is a side view of a photonic integrated circuit in accordance with the present invention.

FIG. 1 is a side view of a photonic integrated circuit in accordance with the present invention.

Device 100 is shown, with wafer 102, film 103, waveguide layer 104, modulator/mode converter 106, gain region 108, and photodetector 110 as shown. DBR reflector 112 are also shown.

Wafer 102 is typically a silicon CMOS wafer, but can be other materials, such as glass, as desired. Film 103 is typically silicon oxide, but can also be a nitride or silicon oxynitride if desired without departing from the scope of the present invention. Waveguide layer 104 is on film 103, and is the silicon waveguide layer for device 100. Modulator/mode converter 106, tunable laser 108, photodetector 110, and rib waveguides 112 are typically Indium Gallium Arsenide Phosphide (InGaAsP), but can be other materials, such as GaInAsN, or other III-V or II-VI materials, without departing from the scope of the present invention.

A thin film of InGaAsP is deposited on a Semiconductor-On-Insulator (SOI) waveguide. This allows for evanescent coupling of the light in the SOI waveguide 104 to the quantum wells in the III-V material 108. DBR reflectors 112 are patterned for reflection within the waveguide.

Lateral Structure

Figure 2:
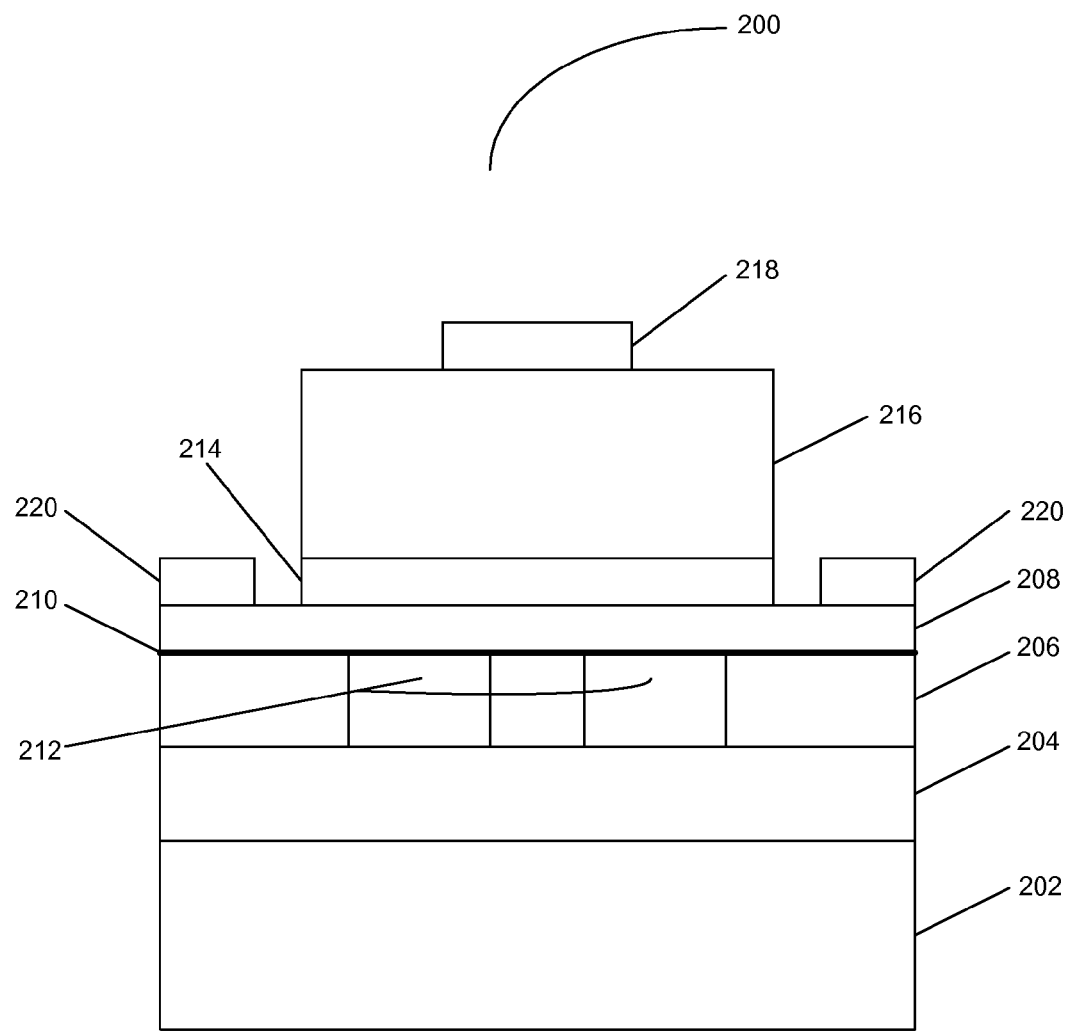
FIG. 2 illustrates a cross-sectional view of the offset quantum well absorption region in accordance with the present invention.

FIG. 2 illustrates a cross-sectional view of the offset quantum well gain region in accordance with the present invention.

Device 200 comprises wafer 202, oxide layer 204, semiconductor layer 206, and spacer layer 208, which is bonded to semiconductor layer 206 at bonding interface 210. Within semiconductor layer 206 resides gaps 212, typically air gaps 212. On spacer layer 208 resides the quantum structure 214, and then bulk semiconductor layer 216. Contact 218 and contacts 220 are also shown.

Typically, wafer 202 is a silicon substrate, oxide layer 204 is silicon oxide, and semiconductor layer 206 is silicon, which together comprise a SOI structure. Gaps 212 form the sides of SOI waveguides. Gaps 212 (also known as cladding) can be air gaps, as well as refilled silicon oxide, silicon oxynitride, or silicon nitride, or other materials, without departing from the scope of the present invention. Further, the shape of gaps 212, when viewed from the top, can be linear, or in a circular or ring shape, or in other shapes, without departing from the scope of the present invention.

Spacer layer 208 is a semiconductor material, typically a III-V material, typically Indium Phosphide (InP), but can be other compound semiconductor materials if desired. The compound semiconductor layer 214 typically comprises a Multiple Quantum Well (MQW) layer and Separated Confinement Heterostructure (SCH) layers, as described in FIG. 3. Bulk semiconductor layer 216 is also typically InP, but can be other semiconductor materials, typically III-V semiconductor materials, without departing from the scope of the present invention.

Spacer layer 208 is typically bonded to semiconductor layer 206 at interface 210. The bonding technique used is described in the art, in, e.g., U.S. Pat. Nos. 6,074,892, 6,147,391, 6,130,441, and 6,465,803, which are incorporated by reference herein, and further described in the appendices attached to the present invention, which are incorporated by reference herein. Additional bonding to create additional layers are also possible within the scope of the present invention, which would create additional interfaces 210 within device 200.

Layer 216 may also comprise a grating which would create a distributed feedback laser within device 200, a grating in the oxide layer 204 to create a distributed Bragg reflector (DBR) laser, or other layers or components to create other optical lasing devices without departing from the scope of the present invention.

Figure 3:
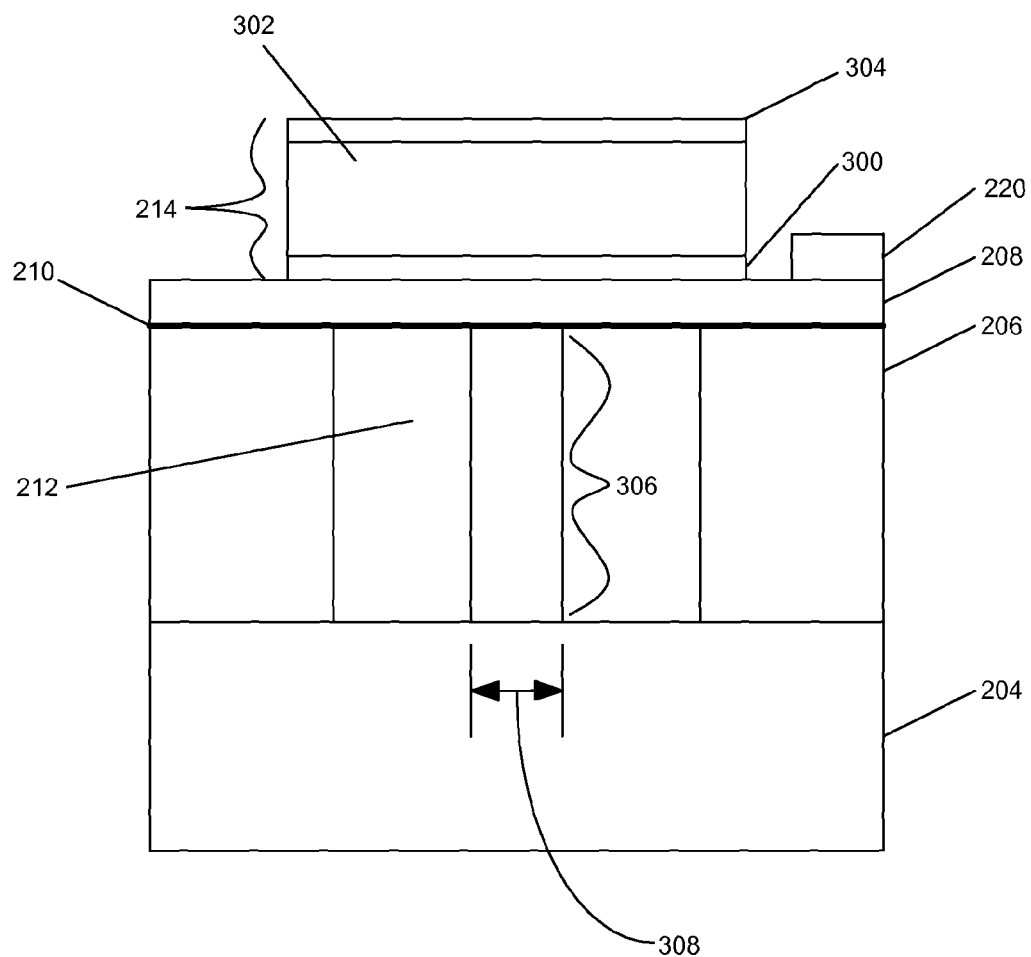
FIG. 3 illustrates another view of the quantum well region shown in FIG. 2 in accordance with the present invention.

FIG. 3 illustrates a detailed view of the quantum well region shown in FIG. 2 in accordance with the present invention.

Compound semiconductor region 214 comprises an SCH layer 300, a MQW layer 302, and an SCH layer 304. Typically, three to five quantum well layers are present in MQW layer 302, but a larger or smaller number of quantum well layers or bulk layers can be present without departing from the scope of the present invention. Further, the core portion of semiconductor layer 206 has a height 306 and a width 308, which dimensions determine the confinement factor of the device 200. Further, the thickness of each of the layers in the MQW layer 302 also play a part in the confinement factor for a device 200 made in accordance with the present invention.

Confinement Factor

Figure 4:
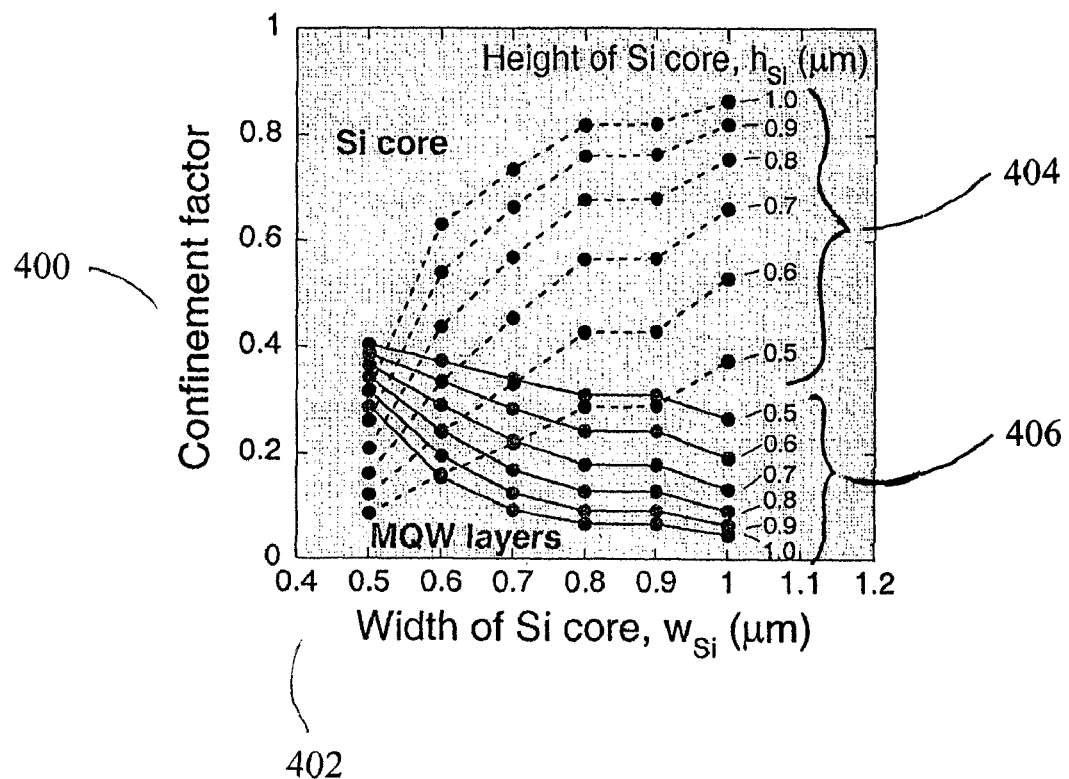
FIG. 4 illustrates the confinement factor versus the width and height of the silicon core in accordance with the present invention.

FIG. 4 illustrates the confinement factor versus the width and height of the silicon core in accordance with the present invention.

The graph of FIG. 4 shows the confinement factor 400 versus the width 308, shown on y-axis 402, of the silicon core portion of semiconductor layer 206. For a range of heights 306, the confinement factor of the silicon core, shown as lines 404, and for a range of heights 306, the confinement factor 400 of the multiple quantum well region varies as a monotonic function of width 402. As the height of the core gets higher, the confinement factor 400 within the waveguide goes up; as the height of the core goes up, the confinement factor in the MQW layers 406 goes down.

Fabrication and Integration of Separate Devices

Typically, a chip-level bonding approach is used to bond one type of material to another. The chip-level bonding approach works well for discrete devices, however, alignment is typically an issue. There are some devices, such as integrated optical amplifiers, that are difficult to fabricate using a chip-level approach because of reflections at the interface between the III-V layer and the silicon substrate.

However, the present invention contemplates using a wafer-level bonding approach, where a III-V wafer is bonded to a silicon wafer, the III-V substrate is removed, and the III-V layers are then processed into various types of devices.

Figure 5:
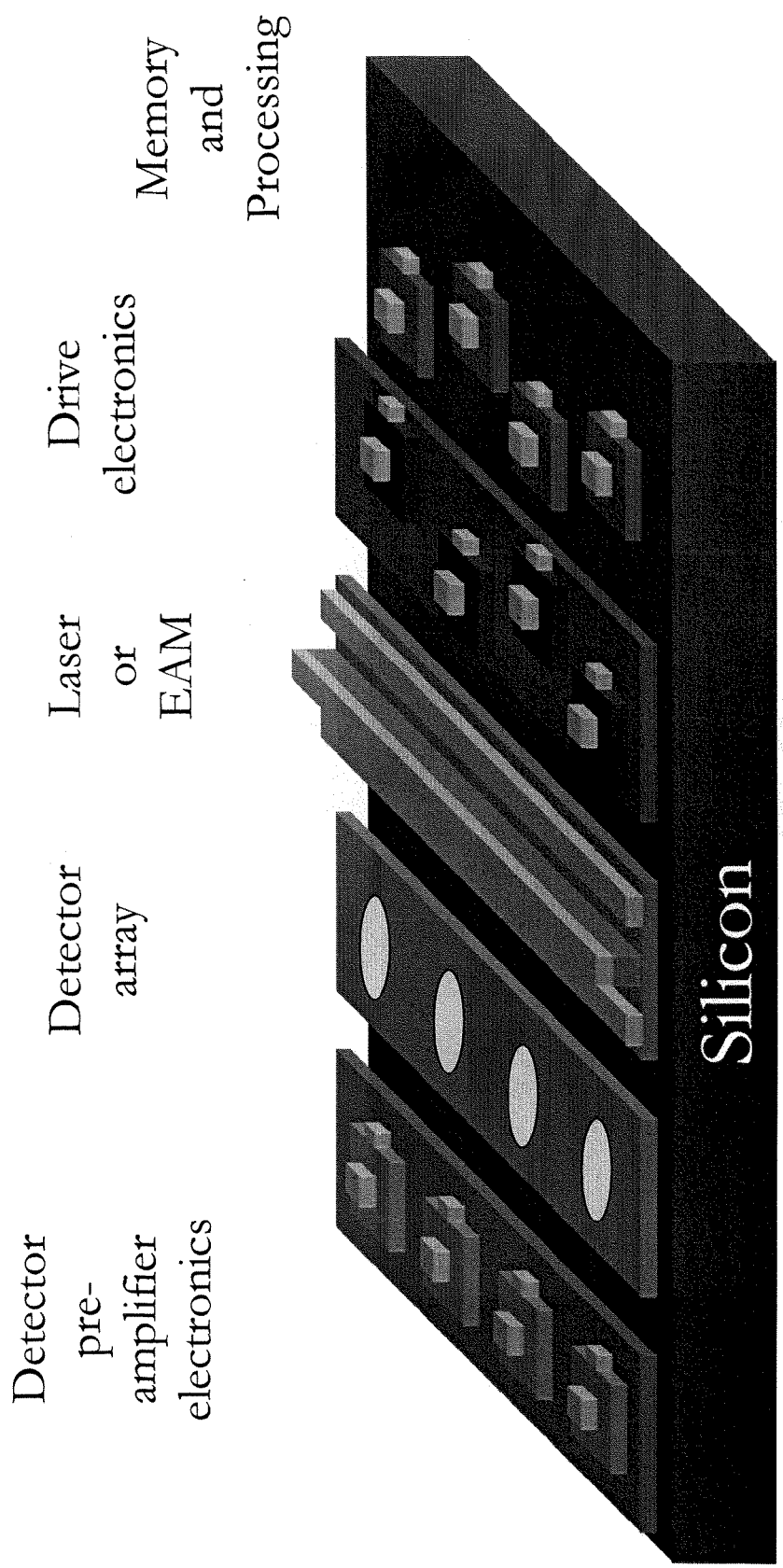
FIG. 5 illustrates a processed chip with different devices on a single wafer in accordance with the present invention.

FIG. 5 illustrates a processed chip with different devices on a single wafer in accordance with the present invention.

As shown in FIG. 5, many different types of devices can be integrated on a single wafer or chip using the process of the present invention. For example, detector pre-amplifier electronics, the detector array, a laser or modulator, drive electronics, and memory/processing circuits can now all reside on a single piece of semiconductor substrate, because the qualities of the silicon that are desirable, e.g., avalanche gain, is now electrically bonded to a material that is a better absorber than silicon.

Figure 6:
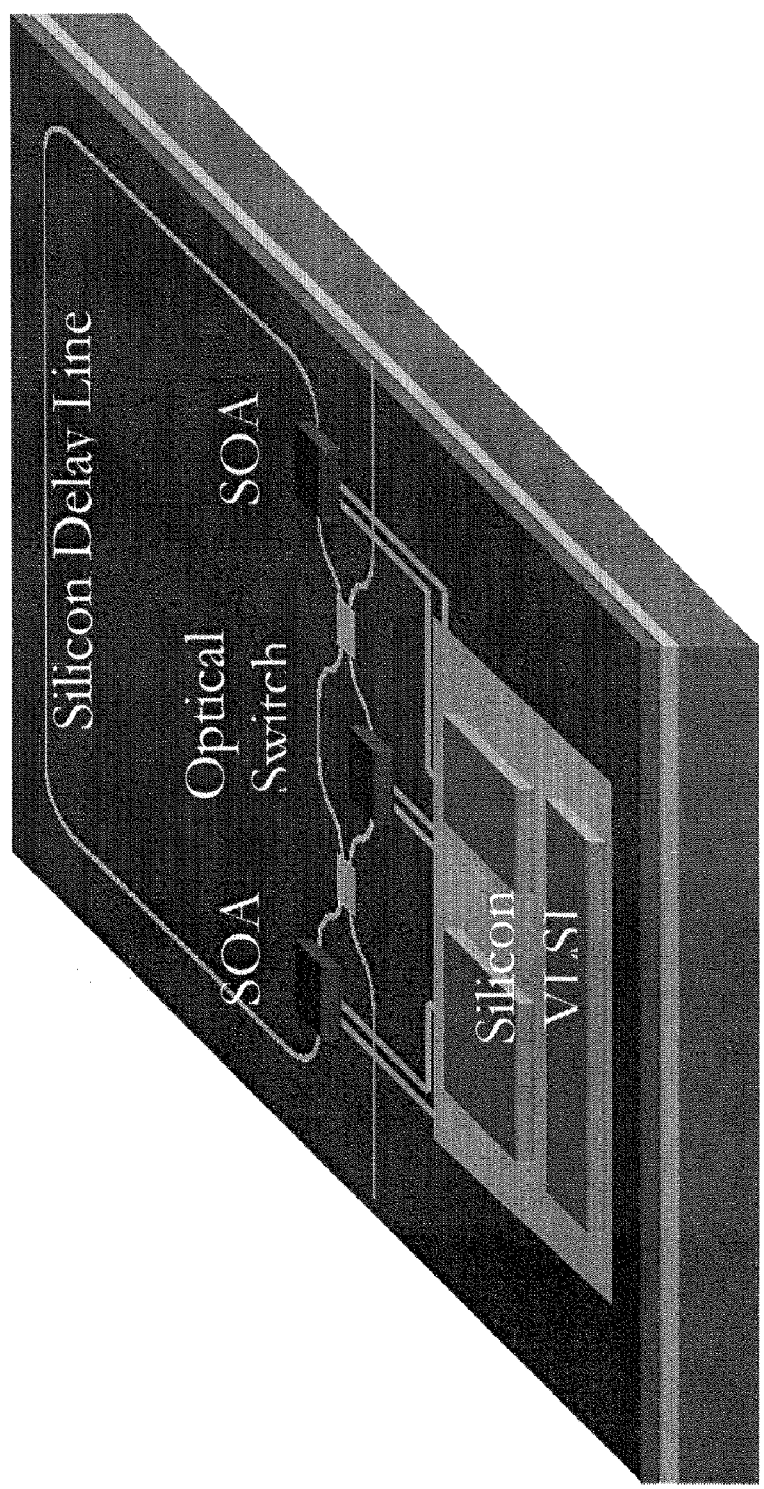
FIG. 6 illustrates an optical buffer memory structure in accordance with the present invention.

FIG. 6 illustrates an optical buffer memory structure in accordance with the present invention.

Figure 7:
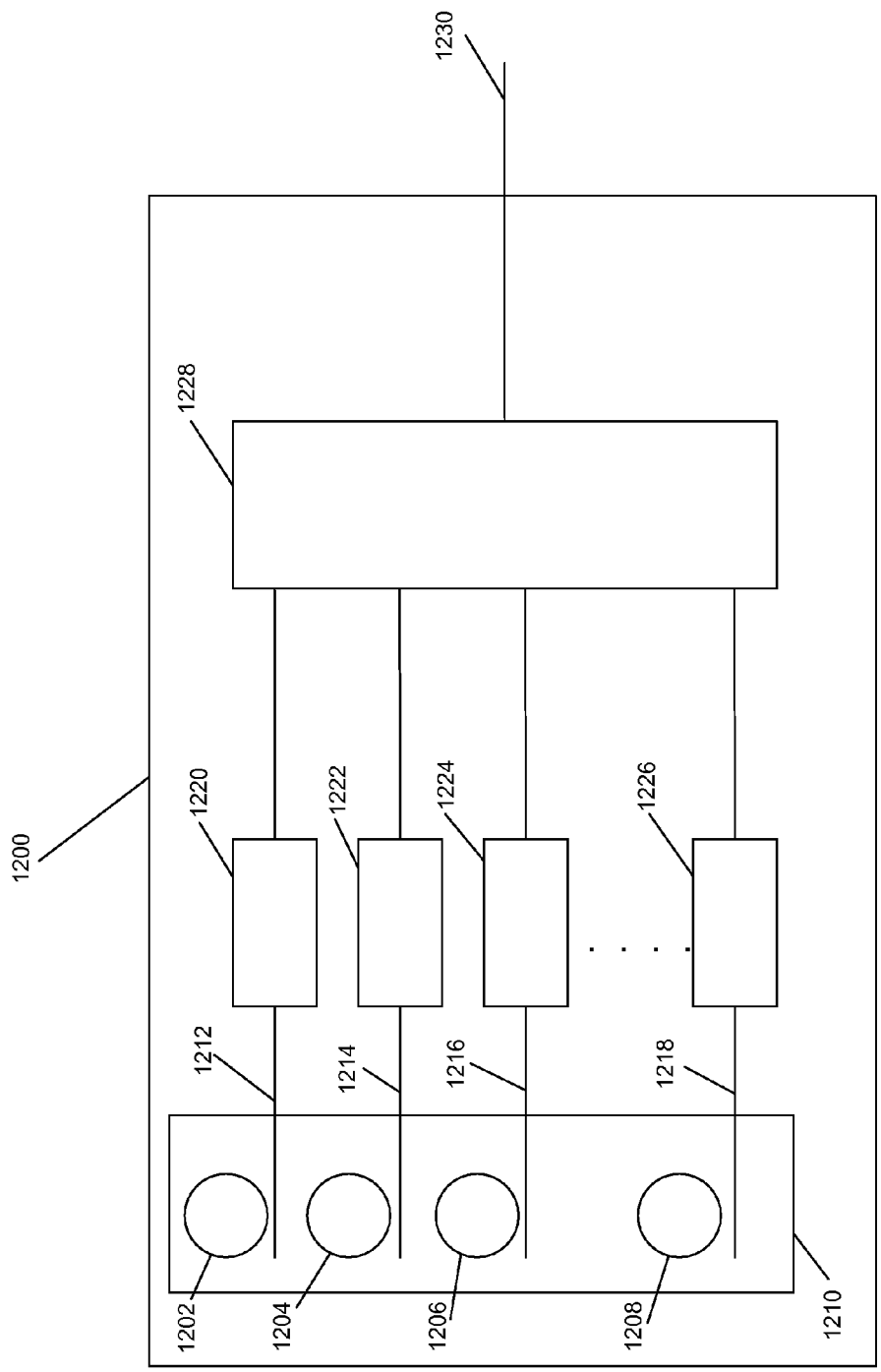
FIG. 7 illustrates an integrated silicon transmitter photonics chip in accordance with the present invention.

FIG. 7 illustrates an integrated silicon transmitter photonics chip in accordance with the present invention.

Chip 1200 comprises ring lasers 1202-1208, which are evanescent lasers. Each ring laser 1202-1208 can produce different wavelengths if desired. Ring lasers 1202-1208 have their waveguides resident in chip 1200, which is typically silicon, and the gain region in the bonded region 1210, which is typically a III-V material.

Ring lasers 1202-1208 are then coupled to SOI waveguides 1212-1218 respectively, which are coupled to modulators 1220-1226. Modulators 1220-1226 are resident in the chip 1200, which, again, is typically silicon, but can be other materials without departing from the scope of the present invention.

Modulators 1220-1226 are then coupled via SOI waveguides to multiplexer 1228, which has an output 1230. Output 1230 comprises a signal which contains all of the wavelengths produced by ring lasers 1202-1208. Additional circuitry can be provided to selectively eliminate one or more of the ring lasers 1202-1208 wavelengths from being included in output 1230.

As seen in FIG. 7, the evanescent coupling of the present invention can be performed at the wafer level, partial wafer level, or die level, depending on the application or desired device, which provides for selective integration of III-V materials or other materials with a silicon platform.

Waveguide Photodetector

Figure 8:
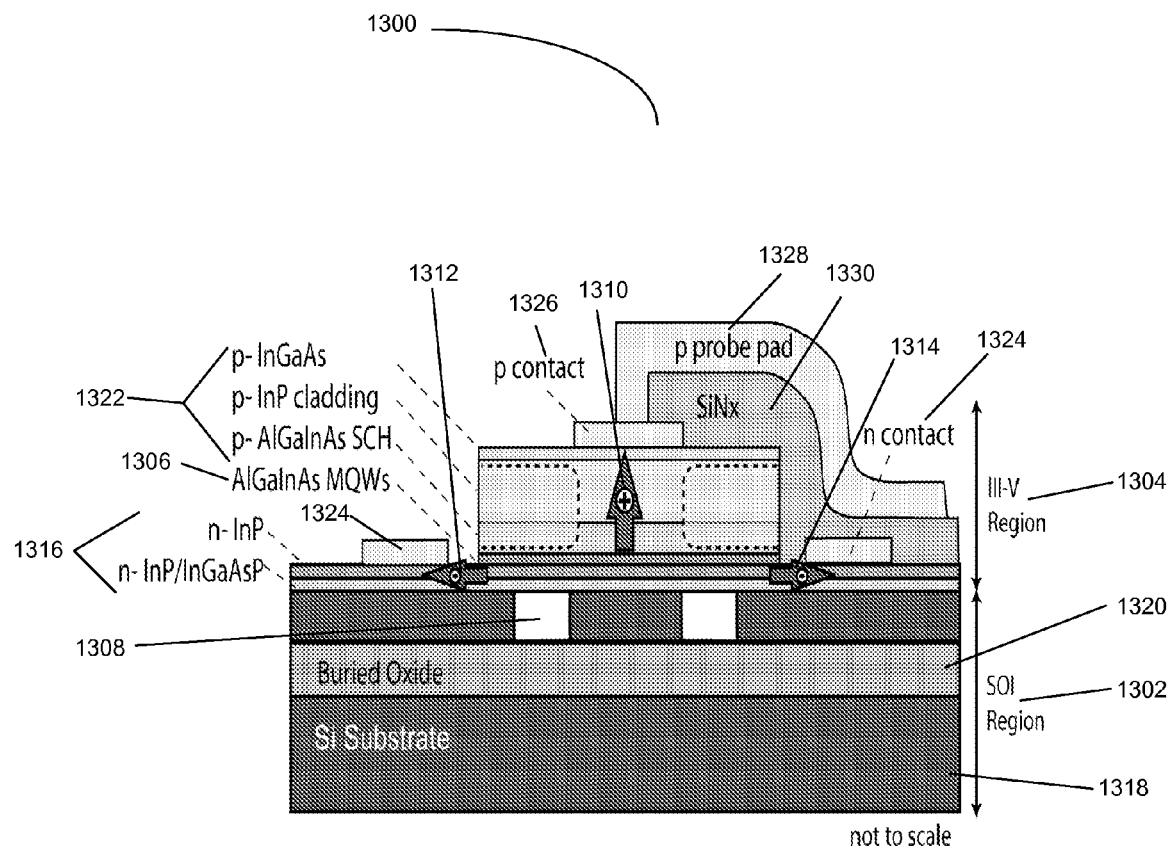
FIGS. 8-10 illustrate a hybrid silicon evanescent waveguide photodetector structure in accordance with the present invention.
Figure 9:
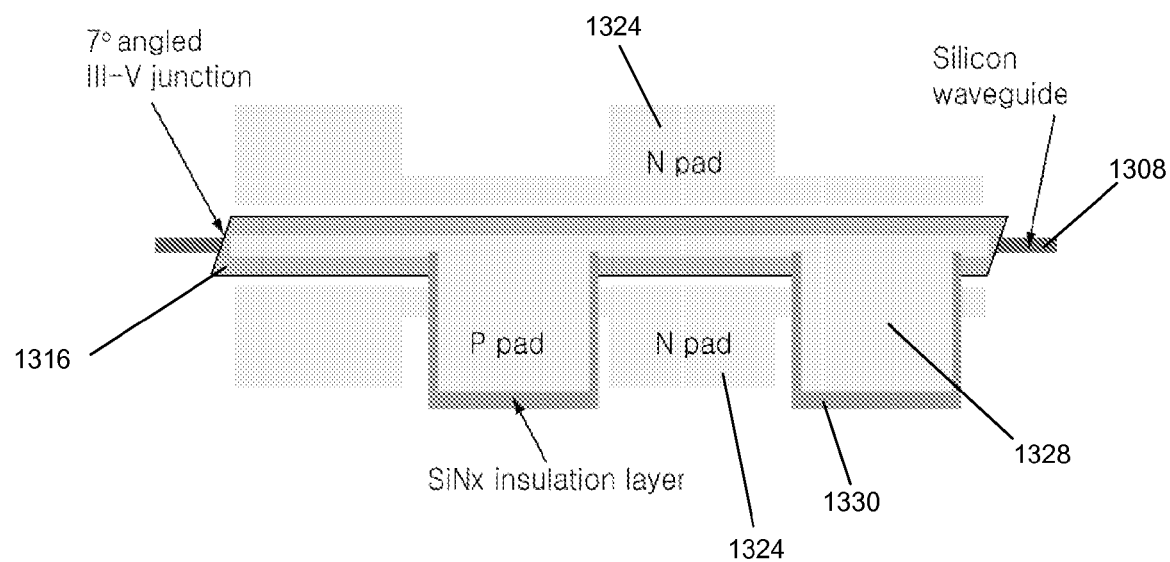
Figure 10:
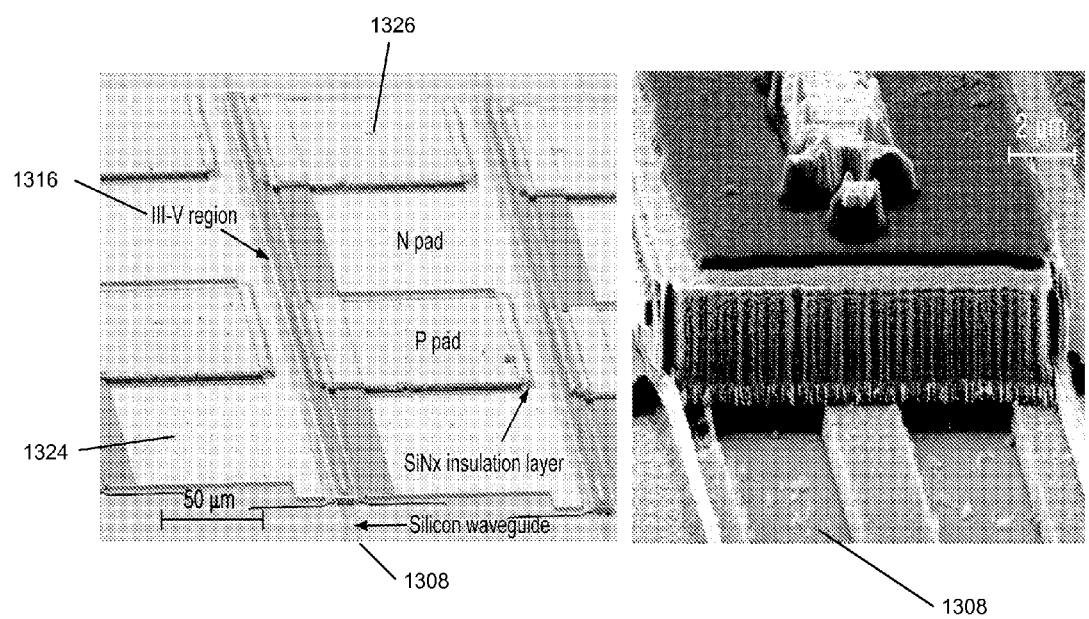

FIGS. 8-10 illustrate a hybrid silicon evanescent waveguide photodetector structure in accordance with the present invention.

Overview

FIG. 8 shows a waveguide photodetector using a hybrid waveguide structure consisting of AlGaInAs quantum wells bonded to a silicon waveguide. The light in the hybrid waveguide is absorbed by the AlGaInAs quantum wells under reverse bias. The photodetector has a fiber coupled responsivity of 0.31 A/W with an internal quantum efficiency of 90% over the 1.5 micron wavelength range. This photodetector structure can be integrated with silicon evanescent lasers for power monitors or integrated with silicon evanescent amplifiers for preamplified receivers.

The present invention comprises a hybrid silicon evanescent waveguide photodetector, which has excellent quantum efficiency, low dark current, and an extended wavelength range over previously fabricated devices. For example, experimental data has shown that a detector in accordance with the present invention operates with a responsivity of 1.1 A/W, a quantum efficiency of 90% covering a wavelength range up to 1600 nm, and dark current of less than 100 nA at a reverse bias of 2 V.

Device Structure and Fabrication

FIG. 8 shows detector 1300, with SOI region 1302 and III-V region 1304. The SOI region 1302 is bonded to the III-V region 1304 as described herein. The hybrid silicon evanescent photodetector 1300 comprises of AlGaInAs quantum wells 1306 bonded to a silicon waveguide 1308. As light propagates through the hybrid waveguide 1308, it is absorbed in the III-V region generating electron hole pairs. When the device is under reverse bias, the carriers are swept away as shown with the three arrows 1310, 1312, and 1314. The input to the photodetector is a passive silicon waveguide 1308. At the junction of the hybrid waveguide 1316 and the passive silicon waveguide 1308, the III-V region of the hybrid waveguide 1316 is tilted by 7° to reduce the reflection at the passive waveguide 1308 transition, as shown in FIG. 9. Other angles can be used without departing from the scope of the present invention; such angles may be required for different materials systems or for other reasons based on the design and desired output of the device 1300.

The silicon waveguide 1308 is typically formed on a <100> surface of an undoped silicon-on-insulator (SOI) substrate 1318 with a 1 micron thick buried oxide 1320 using standard projection photolithography and $Cl_2$/Ar/HBr-based plasma reactive ion etching. The silicon waveguide 1308 is typically fabricated with a final height of 0.69 microns, width of 2 microns, and slab thickness of 0.19 microns, but other heights, widths, and slab thicknesses can be used without departing from the scope of the present invention.

The III-V epitaxial structure 1304, including absorbing quantum well layers 1306, is typically grown on an InP substrate. The photodetector 1300 active absorbing region 1306 typically consists of eight compressively strained quantum wells (0.85%), and nine tensile strained barriers (−0.55%). The total thickness of the undoped quantum well region 1306 is typically 0.146 μm. This III-V structure 1304 is then transferred to the patterned silicon wafer through low temperature oxygen plasma assisted wafer bonding, which typically uses temperatures at approximately 300° C. annealing temperature under vacuum for approximately 12 hours. Different temperatures and conditions can be used without departing from the scope of the present invention.

After removal of the InP substrate, mesas are formed by dry-etching the p-type layers 1322, and a subsequent wet etch of the quantum well layer 1306 to the n-type layers 1316 is performed. Contacts 1324, typically made from a Ni/Au/Ge/Ni/Au alloy, although other materials can be used, are deposited onto the exposed n-type InP layer 1316, typically 10 μm away from the center of the silicon waveguide 1308. P contacts 1326 are then deposited on the center of the mesas of the absorber region.

After proton implantation on the two sides of the p-type mesa, Ti/Au p-probe pads 1328 are deposited. A 450 nm thick $SiN_x$ dielectric layer 1330 is used for the electrical isolation between the p-probe pad 1328 and the n-type InP layer portion of 1316. The III-V mesa region on the silicon input and output waveguide is then dry etched using the same process used during the p-mesa definition, exposing the passive input and output silicon waveguides.

Figure 11:
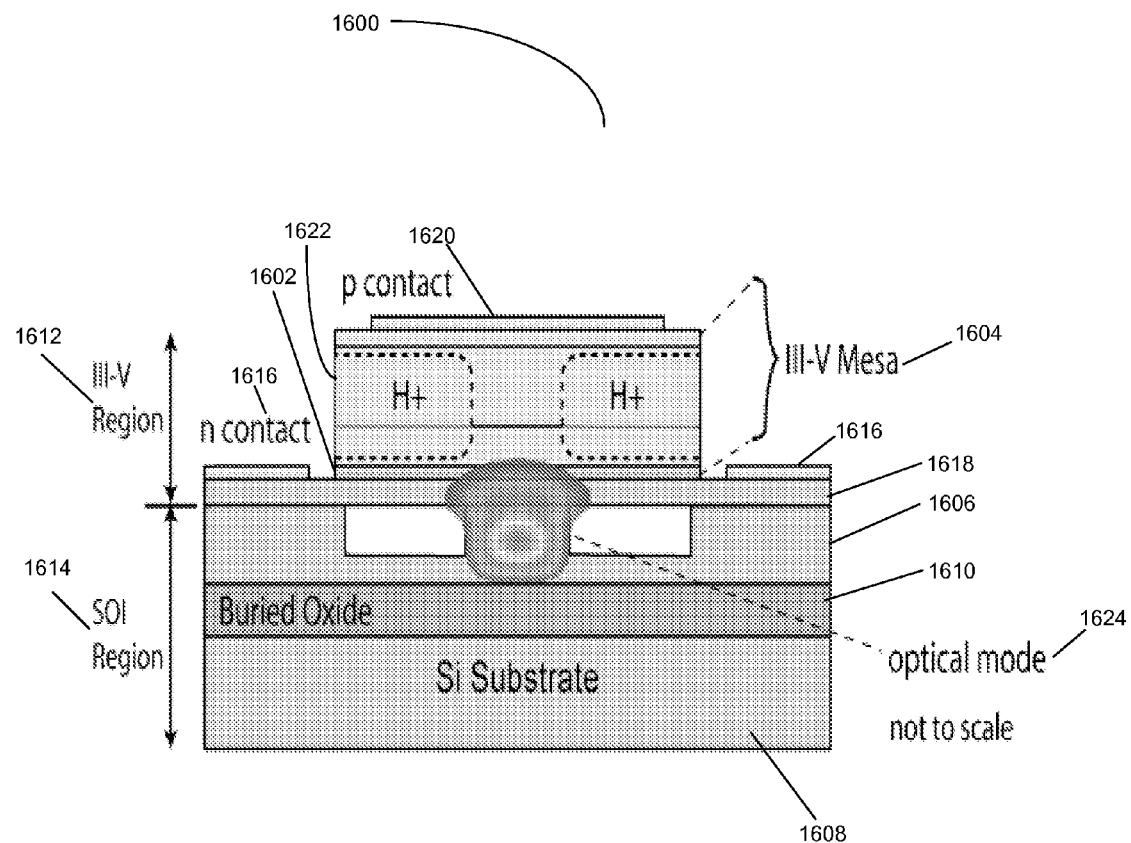
FIGS. 11, 12A and 12B illustrate a racetrack laser/photodetector in accordance with the present invention.

The sample is diced with a silicon facet angle of 7° as shown in FIG. 9. After the facets are polished, an antireflection coating of $Ta_2O_5$ (~5% of reflectivity) is deposited to the silicon waveguide 1308 facets. The final length of the hybrid photodetector 1300 is typically 400 μm. A SEM image of the final fabricated hybrid photodetector and a close view of the junction at the device input are shown in FIGS. 10 and 11, respectively. The silicon confinement factor is calculated to be 65% with the fabricated device dimensions while the quantum well 1306 confinement is calculated to be 4%.

The measured TE responsivity of the typical device according to the present invention at 1550 nm is 0.31 to 0.32 A/W, and is roughly constant over a range of bias conditions from 0.5V to 3V. At a reverse bias of 3V the quantum efficiency is 90% at 1550 nm. From measurements of output power from a silicon output waveguide, the TE modal absorption coefficient is estimated to be 75 cm$^{-1}$, which corresponds to a material TE absorption coefficient of 1875 cm$^{-1}$ at zero bias assuming a 4% quantum well confinement factor. TM responsivity was measured at 0.23 A/W at a wavelength of 1550 nm, which is typically lower than TE responsivity because of the orientation of the compressively strained quantum wells.

The dark current is typically 50 nA to 200 nA with a bias range of −1V to −4 V, and breakdown occurs when the reverse bias exceeds 16 V. The exponential increase of dark current as reverse bias is increased indicates that the dark current is likely dominated by band-to-band tunneling. The diode ideality factor (n) under small forward bias (<0.5 V) is measured to be 2, indicating that the recombination current in the quantum well region is dominant. The 11 ohm series resistance beyond diode turn-on (0.8 V) is due to the thin n-layer and the contact resistances.

The frequency response of the device was measured by a network component analyzer with a 50Ω termination. The bandwidth of the device is 470 MHz at a reverse bias of 4 V. The measured bandwidth agrees with a RC limited bandwidth of 482 MHz, and the frequency response is limited by the large pad and detector resistance. The capacitance of the mesa can be reduced by reducing the width and length of the III-V mesa. The mesa capacitance can also be reduced by modifying the proton implant profile such that it extends through the top InGaAs p contact layer 1326 of the mesa.

Racetrack Laser/Photodetector

Figure 12A:
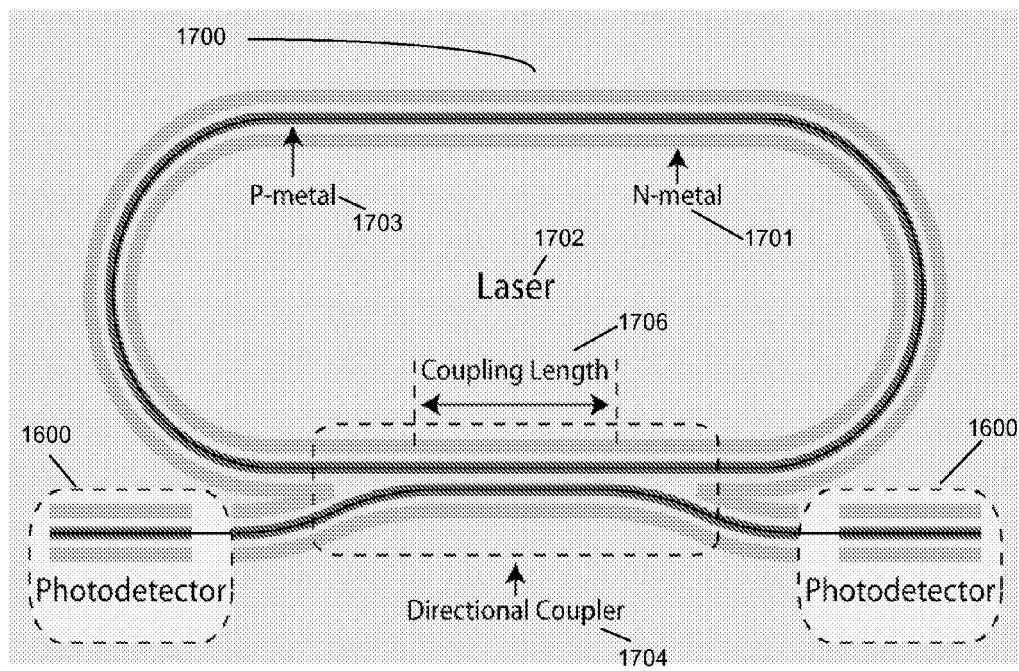
Figure 12B:
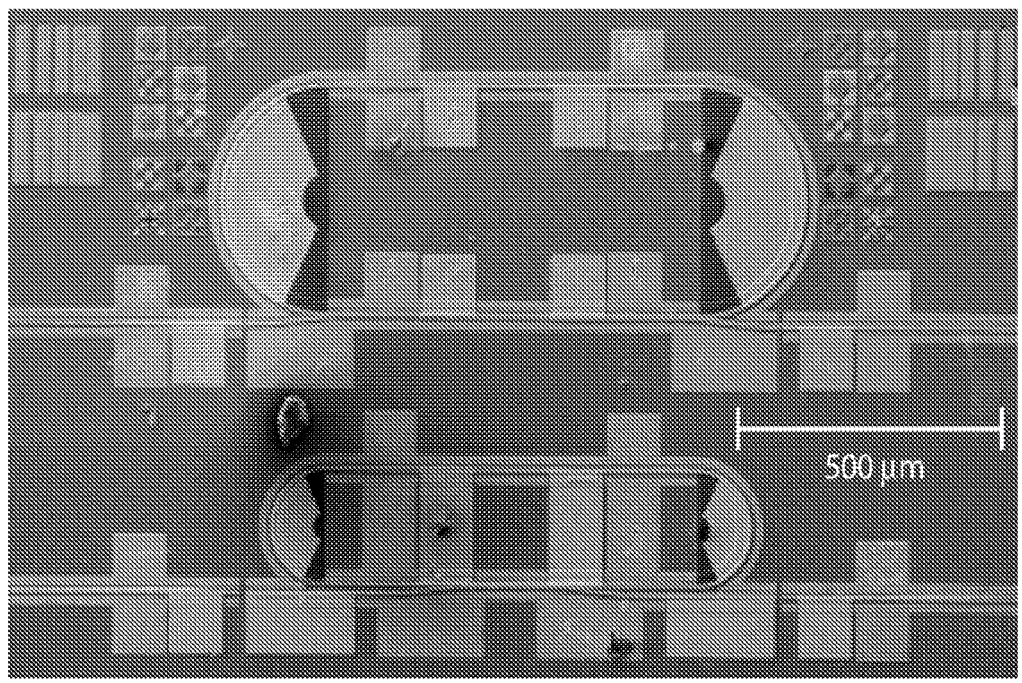

FIGS. 11, 12A and 12B illustrate a racetrack laser/photodetector in accordance with the present invention.

The present invention also contemplates a racetrack resonator laser integrated with a plurality of photodetectors on the hybrid AlGaInAs-silicon evanescent device platform. Unlike previous demonstrations of hybrid AlGaInAs-silicon evanescent lasers and photodetectors, the present invention demonstrates an on-chip racetrack resonator laser that does not rely on facet polishing and dicing in order to define the laser cavity.

The laser runs continuous-wave (c.w.) at a typical wavelength of 1590 nm and a typical threshold of 175 mA. The laser also has a typical maximum total output power of 29 mW and a typical maximum operating temperature of 60 C. The output of the laser light is directly coupled into a pair of on-chip hybrid AlGaInAs-silicon evanescent photodetectors used measure the laser output.

Device Structure and Fabrication

FIG. 11 illustrates the hybrid AlGaInAs-silicon evanescent device in a cross-sectional view. The device 1600 is fabricated using an AlGaInAs quantum well 1602 epitaxial structure 1604 that is bonded to a low-loss silicon rib waveguide 1606. The silicon rib waveguide 1606 is typically formed on the <100> surface of an undoped silicon-on-insulator (SOI) substrate 1608 with a 1 micron thick buried oxide 1610 using standard projection photolithography and plasma reactive ion etching techniques. The silicon waveguide 1606 is typically fabricated with a final height, width, and rib-etch depth of 0.69 microns, 1.65 microns, and 0.5 microns, respectively, although other heights, widths, and rib-etch depths can be used without departing from the scope of the present invention.

The III-V structure 1612 comprising epitaxial structure 1604 is transferred to the patterned silicon wafer 1614 through a low temperature oxygen plasma assisted wafer bonding process described hereinabove.

After InP substrate removal, 10 μm (typical) wide mesas 1604 are formed using photolithography and by plasma reactive ion etching through the p-type layers and selective wet etching of the quantum well layers 1602 to the n-type layers. Ni/AuGe/Ni/Au alloy n-contacts 1616 are deposited onto the exposed n-type InP layers 1618 on both sides of the mesa 1604. Pd/Ti/Pd/Au p-contacts 1620 are then deposited on the approximate centers of the mesas 1604. The p-region 1622 on the two sides of the mesa are implanted with protons (H+) which electrically insulates the p-type InP resulting in a ~4 micron wide p-type current channel down through the non conductive p-type mesa 1604, preventing lateral current spreading in the p-type mesa 1604. The electrical current flows through the center of the mesa to achieve a large overlap with the optical mode 1624.

The laser layout is shown in FIG. 17A, and a SEM micrograph view of the laser layout is shown in FIG. 17B. The laser layout 1700 comprises a racetrack ring resonator 1702 having n-metals 1701 and p-metal 1703, with a typical straight waveguide length of 700 microns. A directional coupler 1704 is formed on the bottom arm by placing a bus waveguide 0.5 micron away from the racetrack 1702. Four device 1700 designs were fabricated with varying ring radii, and coupler 1704 interaction lengths 1706 ($L_{interaction}$).

Table 1 shows the device 1700 layout breakdown with the corresponding cavity lengths ($L_{cavity}$) and the computed coupling percentage to the bus waveguide 1606. The laser power is collected into the two photodetectors 1600. These photodetectors 1600 have the same waveguide architecture as the hybrid laser 1700, the only difference being that they are reverse biased to collect photo-generated carriers.

TABLE 1

Ring dimensions and coupling parameters

| Radius | $L_{cavity}$ | $L_{interaction}$ | Computed Feedback Coupling |
|---|---|---|---|
| 200 μm | 2656 μm | 600 μm | 3% |
|  |  | 400 μm | 12.6% |
| 100 μm | 2028 μm | 300 μm | 36% |
|  |  | 100 μm | 85% |

The integration of racetrack laser 1700 with photodetectors 1600 on the hybrid silicon evanescent device platform demonstrates the potential to realize practical photonic integrated circuits on a silicon substrate 1608. These two types of photonic devices are fabricated on a single active region design showing the flexibility of the hybrid silicon evanescent device platform of the present invention. On-chip testing and characterization of the laser simplifies the testing by eliminating facet polishing and characterization uncertainties caused by coupling losses.

The photodetectors 1600 could be PIN detectors, which produce one electron-hole pair for each incident photon. The photodetector could be an avalanche photodiode where the electrons (or holes) generated in the waveguide absorber are multiplied in the avalanche region. This is particularly advantageous when the avalanche layer is silicon, which is known to have a large ratio of electron to hole ionization coefficients, and consequently, is an excellent material for an avalanche photodiode.

CONCLUSION

In summary, embodiments of the invention provide methods and for making an optical device on silicon. The present invention can be used for lasers, modulators, amplifiers, and photodetectors, and devices that use combinations of these devices, such as wavelength converters, channel selectors, 3R regenerators, buffer memories, etc.

A photodetector in accordance with the present invention comprises a silicon-on-insulator (SOI) structure resident on a first substrate, the SOI structure comprising a passive waveguide, and a III-V structure bonded to the SOI structure, the III-V structure comprising a quantum well region, a hybrid waveguide, coupled to the quantum well region and the SOI structure adjacent to the passive waveguide, and a mesa, coupled to the quantum well region, wherein when light passes through the hybrid waveguide, the quantum well region detects the light and generates current based on the light detected. Such a photodetector further optionally includes the quantum well region is an AlGaInAs quantum well region, the hybrid waveguide is tilted with respect to the passive waveguide, the hybrid waveguide is tilted by seven degrees with respect to the passive waveguide, the photodetector is part of an array of photodetectors, the photodetector is integrated with at least one other electronic device, the at least one other electronic device being a CMOS device, the mesa is implanted with protons, and the coupling between the passive waveguide and the hybrid waveguide is evanescent.

An integrated laser/photodetector device in accordance with the present invention comprises a semiconductor-on-insulator (SOI) structure resident on a first substrate, the SOI structure comprising a passive waveguide, a semiconductor structure bonded to the SOI structure, the semiconductor structure comprising a quantum well region, a hybrid waveguide, coupled to the quantum well region and the SOI structure adjacent to the passive waveguide, and a mesa, coupled to the quantum well region, and a lasing device, coupled to the hybrid waveguide, for providing light to the hybrid waveguide to generate current in the photodetector.

Such a device further optionally includes the coupling between the hybrid waveguide and the passive waveguide is evanescent, the SOI structure comprises a silicon substrate, the semiconductor structure comprises a III-V semiconductor material, the lasing device comprises a ring laser, the lasing device is coupled to the photodetector via a directional coupler, and at least one additional photodetector coupled to the lasing device.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims attached hereto and the full breadth of equivalents to the claims.

What is claimed is:

1. A photodetector, comprising:
a silicon-on-insulator (SOI) structure resident on a first substrate, the SOI structure including a silicon layer with a passive waveguide formed therein; and
a III-V structure bonded to the SOI structure, the III-V structure comprising an absorption region wherein the absorption region is coupled to the passive waveguide to form a hybrid waveguide such that an optical mode of the light exists in the passive waveguide and the absorption region, wherein when light passes through the hybrid waveguide, the absorption region detects the light and generates current based on the light detected, and wherein an end of the hybrid waveguide is tilted by between three and twenty degrees with respect to the passive waveguide.

2. The photodetector of claim 1, wherein the absorption region is an AlGaInAs quantum well region.

3. The photodetector of claim 1, wherein the SOI structure comprises a silicon substrate.

4. The photodetector of claim 1, wherein the end of the hybrid waveguide is tilted by seven degrees with respect to the passive waveguide.

5. The photodetector of claim 1, wherein the photodetector is part of an array of photodetectors.

6. The photodetector of claim 1, wherein the photodetector is integrated with at least one other electronic device.

7. The photodetector of claim 6, wherein the at least one other electronic device is a CMOS device.

8. The photodetector of claim 1, further comprising a mesa, coupled to the absorption region, wherein the mesa is implanted with protons.

9. The photodetector of claim 1, wherein the coupling between the passive waveguide and the hybrid waveguide is evanescent.

10. An integrated laser/photodetector device including a ring laser, comprising:
a semiconductor-on-insulator (SOI) structure resident on a silicon substrate, the SOI structure comprising a passive waveguide;
a semiconductor structure bonded to the SOI structure, the semiconductor structure comprising a III-V semiconductor material comprising:
a quantum well absorption region evanescently coupled to the passive waveguide to form a hybrid waveguide such that an optical mode of the light exists in the passive waveguide and the absorption region; and
a mesa, coupled to the quantum well absorption region; and
a lasing device, coupled to the hybrid waveguide, for providing light to the hybrid waveguide to generate current in the photodetector.

11. The integrated laser/photodetector device of claim 10, wherein the lasing device is coupled to the photodetector via a directional coupler.

12. The integrated laser/photodetector device of claim 10, further comprising at least one additional photodetector coupled to the lasing device.

13. An avalanche photodiode, comprising:
a silicon-on-insulator (SOI) structure resident on a first substrate, the SOI structure comprising a silicon avalanche waveguide layer; and
a III-V structure bonded to the SOI structure, the III-V structure comprising:
an absorption region; and
a waveguide, coupled to the absorption region and the SOI structure such that an optical mode of the light exists in the waveguide and the absorption region;
wherein when light passes through the waveguide, the absorption region generates electron current based on the light detected and the electron current is amplified in the silicon avalanche waveguide layer, and wherein an end of the hybrid waveguide is tilted by between three and twenty degrees with respect to the passive waveguide.

14. The avalanche photodiode of claim 13, wherein the avalanche photodiode is part of an array of photodiodes.

15. The avalanche photodiode of claim 13, wherein the avalanche photodiode is integrated with at least one other device.

16. A system comprising:
a silicon layer positioned in a substrate, the silicon layer including at least one passive waveguide formed therein, the passive waveguide comprising a core region positioned between cladding regions, the cladding regions including at least one region comprising air;
a photodetector evanescently coupled to the passive waveguide for detecting light emitting from outside of the photodetector, the photodetector comprising:
a quantum well absorption region coupled to the passive waveguide such that an optical mode of the light exists in the passive waveguide and the quantum well absorption region,
a mesa coupled to the quantum well region, the mesa including an electrical contact thereon, and
one or more electronic components formed in or on the silicon layer, the electronic component being coupled to the photodetector through the electrical contact.

17. The system of claim 16, further comprising one or more optical devices coupled to the passive waveguide.

18. The system of claim 17 wherein the one or more optical devices include at least one of an optical modulator, a photodetector, in-plane or vertical cavity surface emitting lasers, photodetectors, a silicon wavelength converter, a silicon tunable laser, a channel selector, and an optical buffer memory.

19. The system of claim 16 wherein the one or more electronic components includes at least one of pre-amplifier electronics, drive electronics, memory circuits, processing circuits, amplifiers, pre-amplifier electronics and drive electronics.

20. The system of claim 16 wherein at least one of the one or more electronic components is a CMOS component.

21. An integrated laser/photodetector device including a ring laser, comprising:
a semiconductor-on-insulator (SOI) structure resident on a silicon substrate, the SOI structure comprising a passive waveguide;
a semiconductor structure bonded to the SOI structure, the semiconductor structure comprising a III-V semiconductor material comprising:
a quantum well absorption region evanescently coupled to the passive waveguide to form a hybrid waveguide such that an optical mode of the light exists in the passive waveguide and the absorption region; and
a mesa, coupled to the quantum well absorption region; and
a lasing device, coupled to the hybrid waveguide, for providing light to the hybrid waveguide to generate current in the photodetector.

22. A system comprising:
a silicon layer positioned in a substrate, the silicon layer including at least one passive waveguide formed therein, the passive waveguide comprising a core region positiond between cladding regions, the cladding regions including at least one region comprising silicon oxynitride;
a photodetector evanescently coupled to the passive waveguide for detecting light emitting from outside of the photodetector, the photodetector comprising:
a quantum well absorption region coupled to the passive waveguide such that an optical mode of the light exists in the passive waveguide and the quantum well absorption region,
a mesa coupled to the quantum well region, the mesa including an electrical contact thereon, and
one or more electronic components formed in or on the silicon layer, the electronic component being coupled to the photodetector through the electrical contact.

* * * * *